United States Patent
He

(10) Patent No.: US 11,166,394 B2
(45) Date of Patent: Nov. 2, 2021

(54) DISPLAY CARD

(71) Applicant: ASUS GLOBAL PTE. LTD., Singapore (SG)

(72) Inventor: Hui He, Singapore (SG)

(73) Assignee: ASUS GLOBAL PTE. LTD., Singapore (SG)

(*) Notice: Subject to any disclaimer, the term of this patent is extended or adjusted under 35 U.S.C. 154(b) by 0 days.

(21) Appl. No.: 16/815,168

(22) Filed: Mar. 11, 2020

(65) Prior Publication Data

US 2020/0315058 A1 Oct. 1, 2020

(30) Foreign Application Priority Data

Mar. 25, 2019 (CN) .......................... 201920381366.6

(51) Int. Cl.
 *H05K 7/20* (2006.01)
 *G06F 1/18* (2006.01)
 *H05K 5/00* (2006.01)
 *H05K 7/14* (2006.01)

(52) U.S. Cl.
 CPC ......... *H05K 7/20172* (2013.01); *G06F 1/185* (2013.01); *H05K 5/0026* (2013.01); *H05K 7/1427* (2013.01)

(58) Field of Classification Search
 CPC ............. H05K 7/1427; H05K 7/20145; H05K 7/20172; H05K 5/0026; G06F 1/185; G06F 1/20
 See application file for complete search history.

(56) References Cited

U.S. PATENT DOCUMENTS

| 6,359,779 B1* | 3/2002 | Frank, Jr. ................. G06F 1/18 361/679.33 |
| 8,547,312 B2* | 10/2013 | Sato .................. G02F 1/133385 345/87 |
| 2007/0280818 A1* | 12/2007 | Yang ........................ G06F 1/20 415/102 |
| 2009/0231232 A1* | 9/2009 | Chan ...................... G06F 1/266 345/1.3 |

FOREIGN PATENT DOCUMENTS

CN 201293964 Y 8/2009

* cited by examiner

*Primary Examiner* — Mukundbhai G Patel
(74) *Attorney, Agent, or Firm* — McClure, Qualey & Rodack, LLP

(57) ABSTRACT

This application provides a display card including a circuit board, a fan, and a cover body. The fan is disposed on the circuit board. The cover body covers the circuit board and includes a top wall. The top wall includes a first covering portion and a second covering portion. The first covering portion includes an opening to expose the fan. The second covering portion is connected to the first covering portion, and bends towards the circuit board.

10 Claims, 8 Drawing Sheets

DISPLAY CARD

CROSS-REFERENCE TO RELATED APPLICATION

This application claims the priority benefit of Chinese application serial No. 201920381366.6, filed on Mar. 25, 2019. The entirety of the above-mentioned patent application is hereby incorporated by reference herein and made a part of the specification.

BACKGROUND OF THE INVENTION

Field of the Invention

The disclosure relates to a display card.

Description of the Related Art

In general, the server apparatuses are equipped with a plurality of display cards that are installed on a mainboard side by side to improve computing capabilities of the server apparatuses. In such configuration, the space between adjacent display cards is small and is unfavourable for airflow to flow into, further affecting a capability of air intake of a fan of the display cards. Consequently, the heat of the display cards does not effectively dissipated.

BRIEF SUMMARY OF THE INVENTION

This application provides a display card effectively dissipating heat in a close arrangement.

According to one aspect, a display card. The display card includes: a circuit board, a fan, and a cover body. The fan is disposed on the circuit board. The cover body covers the circuit board and includes a top wall. The top wall includes a first covering portion and a second covering portion. The first covering portion includes an opening to expose the fan. The second covering portion is connected to the first covering portion, and bends towards the circuit board.

In conclusion, the cover body of the display card of this application includes a top wall partially bending (is also considered as descending) towards the circuit board, and the bending part of the top wall is located on one side of the fan. In the foregoing structure configuration, even though a plurality of display cards is arranged closely, some space is still reserved between adjacent display cards. In this way, air intake of the fan is not obstructed, and the display card still effectively dissipates heat.

DETAILED DESCRIPTION OF THE EMBODIMENTS

Figure 1:
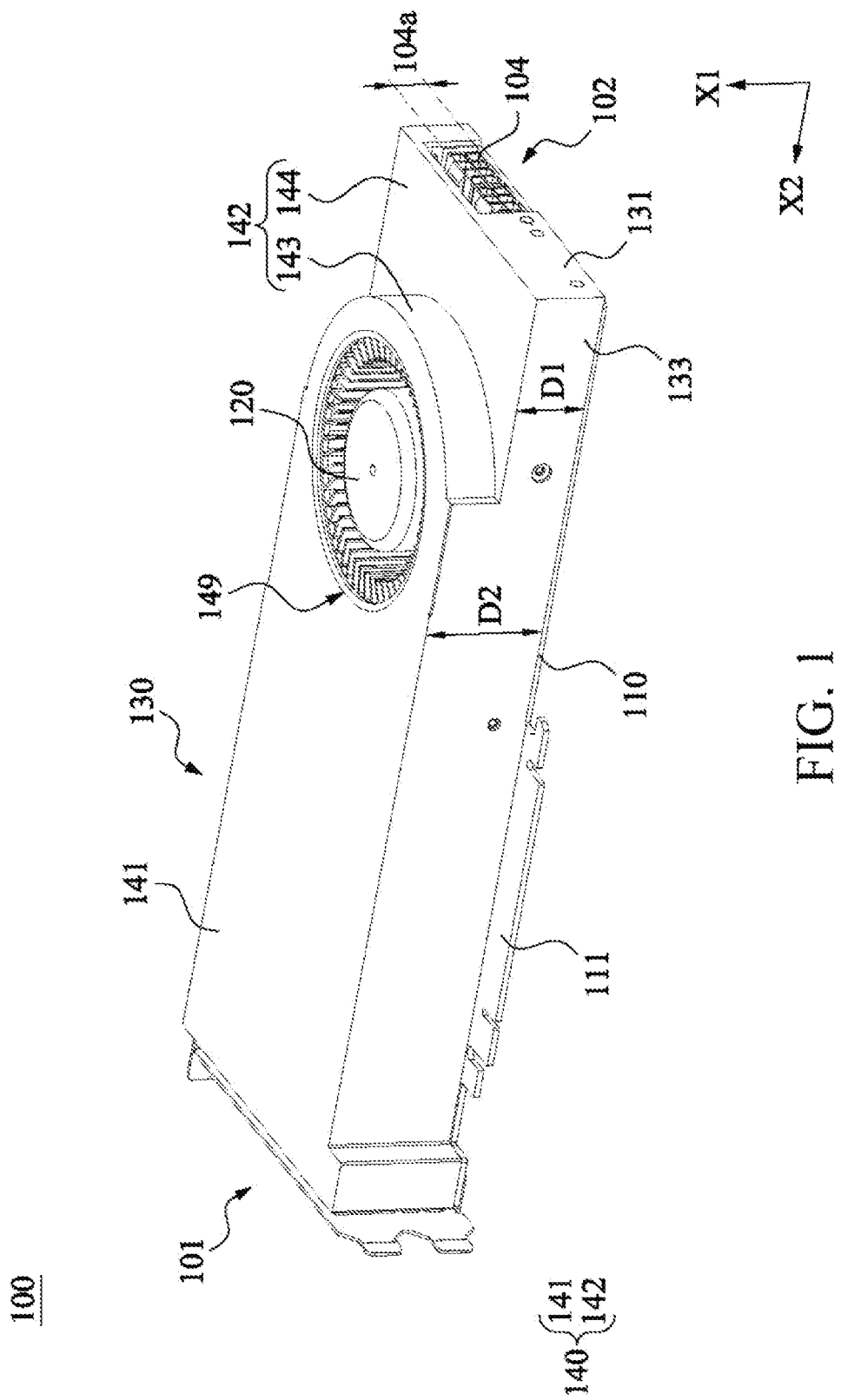
FIG. 1 is a three-dimensional diagram of a display card at one viewing angle according to an embodiment of this application.

To make the description of this application more thorough and complete, reference may be made to the accompanying drawings and the various embodiments described below. Elements in the drawings are not drawn to scale and are provided merely to illustrate this application. Numerous practical details are described below to provide a thorough understanding of this application. However, it will be understood by those of ordinary skill in the relevant art that this application may be implemented without one or more of practical details. Therefore, the details are not intended to limit this application.

Figure 2:
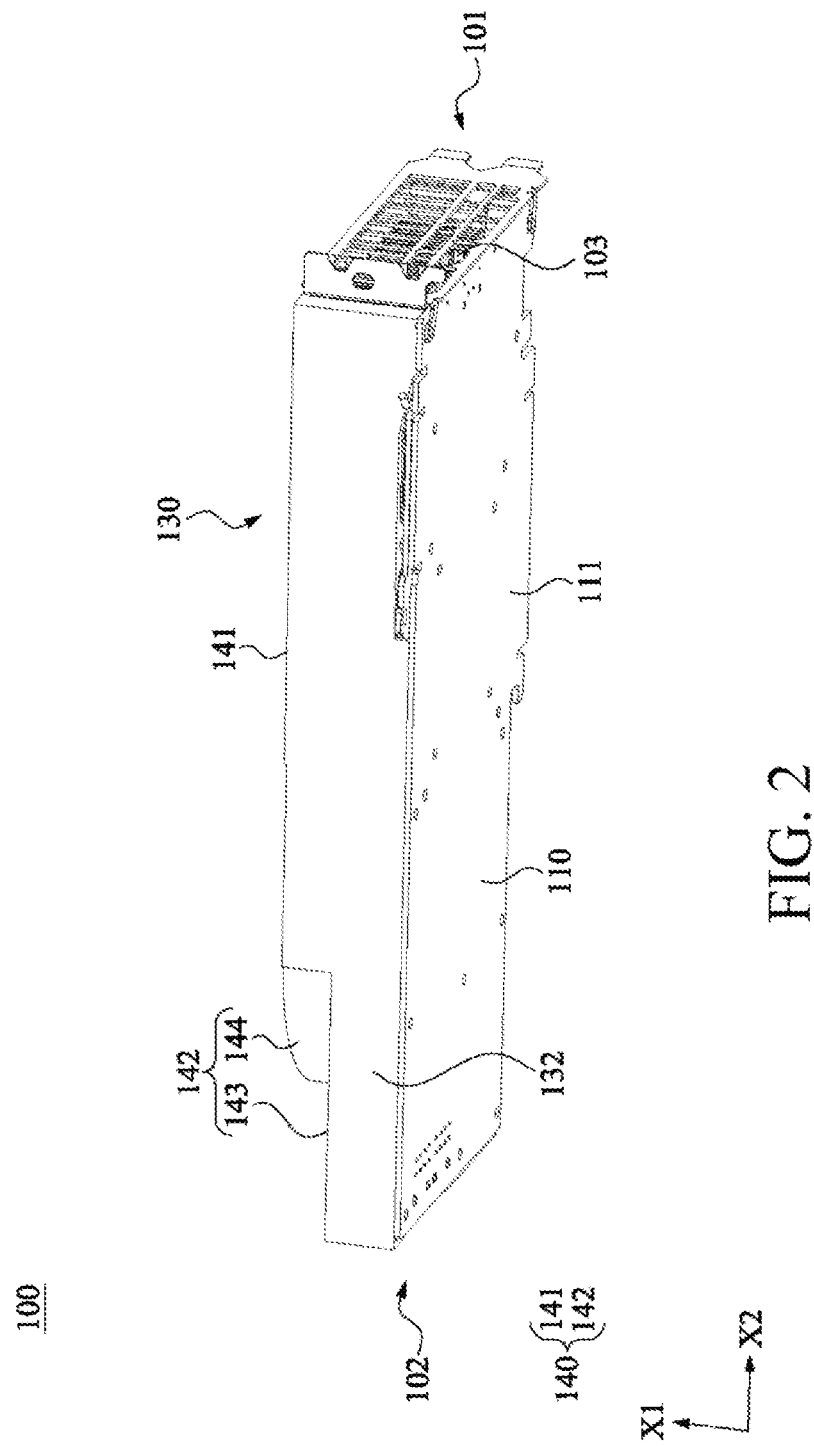
FIG. 2 is a three-dimensional diagram of the display card shown in FIG. 1 at another viewing angle.

FIG. 1 and FIG. 2 are three-dimensional diagrams of a display card 100 at two different viewing angles according to an embodiment of this application. The display card 100 includes a circuit board 110, a fan 120 disposed on the circuit board 110, and a cover body 130 covering the circuit board 110. The display card 100 includes a first end 101 and a second end 102 opposite to the first end 101. The display card 100 further includes at least one first connector 103 (in an embodiment: an output/input connector) located at the first end 101, and a second connector 104 (in an embodiment: a power supply connector) located at the second end 102.

As shown in FIG. 1 and FIG. 2, the cover body 130 includes a top wall 140 and a plurality of side walls 131, 132, and 133. The top wall 140 faces the circuit board 110, the side walls 131, 132, and 133 are connected to the top wall 140, and extend towards the circuit board 110. Specifically, the side wall 131 is located at the second end 102 of the display card 100 and exposes the second connector 104. The side walls 132 and 133 are respectively located on the left side and the right side of the display card 100 and are connected to the side wall 131, so that the side walls 131, 132, and 133 encircle the top wall 140. The circuit board 110 includes a bus connector 111, and the bus connector 111 protrudes from the side wall 133 and is configured to connect to a slot (not shown in the figure) on a mainboard.

As shown in FIG. 1, the top wall 140 of the cover body 130 includes a first covering portion 141 and a second covering portion 142. The first covering portion 141 includes an opening 149 to expose the fan 120. The second covering portion 142 is connected to an edge of the first covering portion 141 away from the first end 101, and the second covering portion 142 bends towards the circuit board 110. That is, the second covering portion 142 descends towards the circuit board 110 relative to the first covering portion 141, to form a section difference with the first covering portion 141. Referring to FIG. 1 and FIG. 2, in this embodiment, the fan 120 is located between the first connector 103 and the second covering portion 142.

Figure 3:
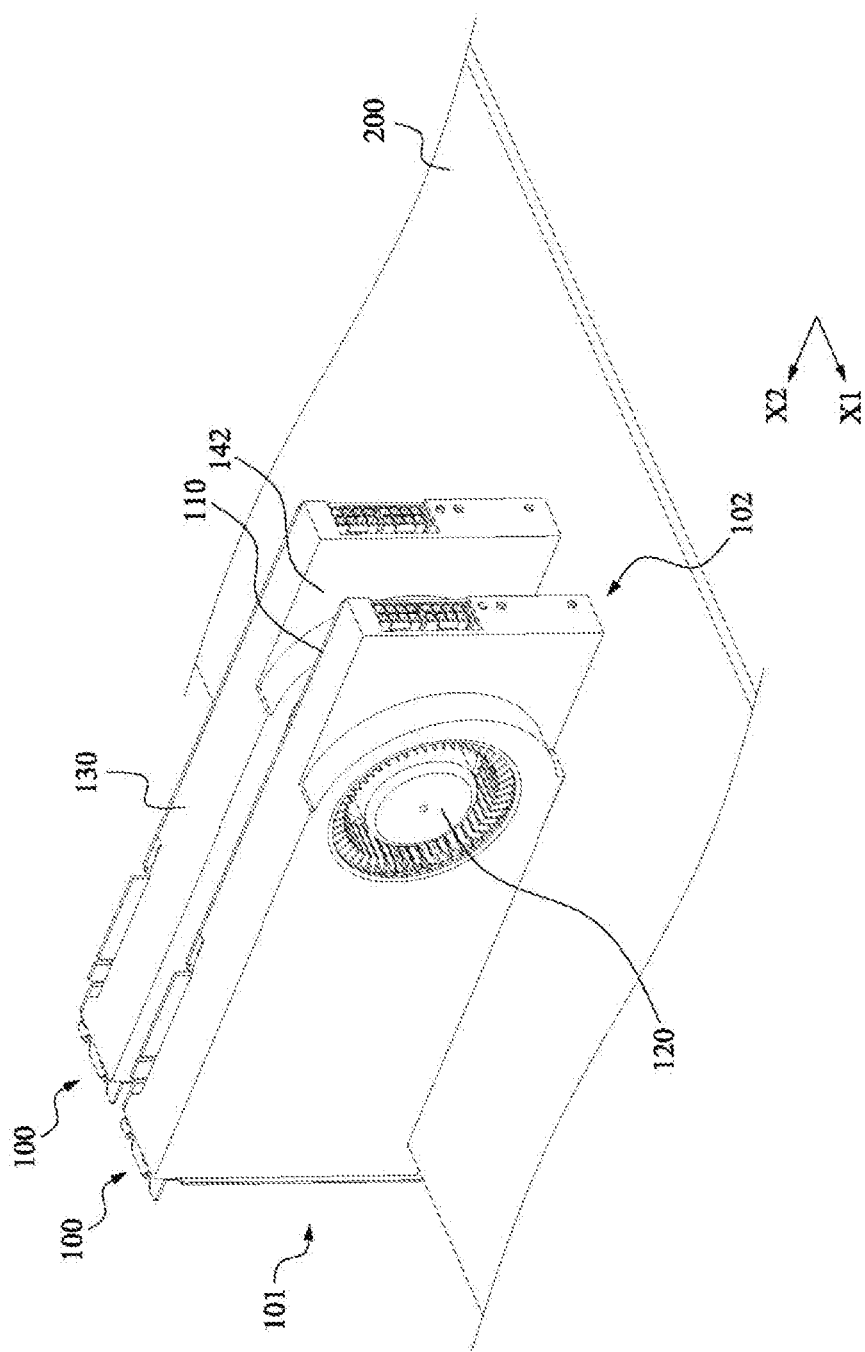
FIG. 3 is a schematic diagram of the display cards shown in FIG. 1 installed on a mainboard side by side.

FIG. 3 is a schematic diagram of the display cards 100 shown in FIG. 1 installed on a mainboard 200 side by side. When the plurality of display cards 100 is closely arranged in a direction X1, a part of the top wall 140 (that is, a part of the second covering portion 142) of the cover body 130 of the display card 100 bends towards the circuit board 110, to keep some space between the second covering portion 142 of the top wall 140 and the back of the circuit board 110 of another adjacent display card 100, so that the air intake of the fan 120 is relatively smooth.

As shown in FIG. 3, in an electronic device, a system fan (not shown in the figure) generates airflow flowing towards a direction X2 (that is, a direction from the second end 102 of the display card 100 towards the first end 101). To optimize heat dissipation efficiency of this design, the second covering portion 142 is located on one side of the fan 120 facing the second end 102 (that is, the fan 120 is disposed between the first end 101 of the display card 100 and the second covering portion 142), to facilitate the fan 120 to introduce the airflow generated by the system fan.

Referring to FIG. 1 again, in some embodiments, the second covering portion 142 includes a first bend section 143 and a second bend section 144. The second bend section 144 is parallel to the first covering portion 141, and there is a section difference between them. Specifically, a distance D1 between the second bend section 144 and the circuit board 110 is less than a distance D2 between the first covering portion 141 and the circuit board 110. In an embodiment, to enable the space between the second bend section 144 and the circuit board 110 to accommodate the second connector 104, the distance D1 between the second bend section 144 and the circuit board 110 is not less than a thickness 104a of the second connector 104.

Based on the above, the first bend section 143 is connected between the second bend section 144 and the first covering portion 141, and the first bend section 143 is perpendicular to the first covering portion 141 and extends from the first covering portion 141 towards the circuit board 110, to make the first covering portion 141, the first bend section 143, and the second bend section 144 form a step-shaped structure. In addition, the second bend section 144 is connected between the first bend section 143 and the side wall 131, so that the airflow generated by the system fan flows to the opening 149 along the second covering portion 142 and the first covering portion 141. Therefore, the airflow is introduced by the fan 120 to the space between the cover body 130 and the circuit board 110 to perform heat dissipation on an electronic element (in an embodiment, a graphics processor) disposed on the circuit board 110.

As shown in FIG. 1, in some embodiments, to maximize the space between adjacent display cards 100, a part of the second covering portion 142 encircles the fan 120. In an embodiment, the first bend section 143 of the second covering portion 142 encircles a part of the fan 120 and extends towards the circuit board 110. Specifically, an end of the first bend section 143 close to the fan 120 includes a curved arc shape, and a curvature centre of the arc shape coincides with an axis centre of the fan 120.

Figure 4:
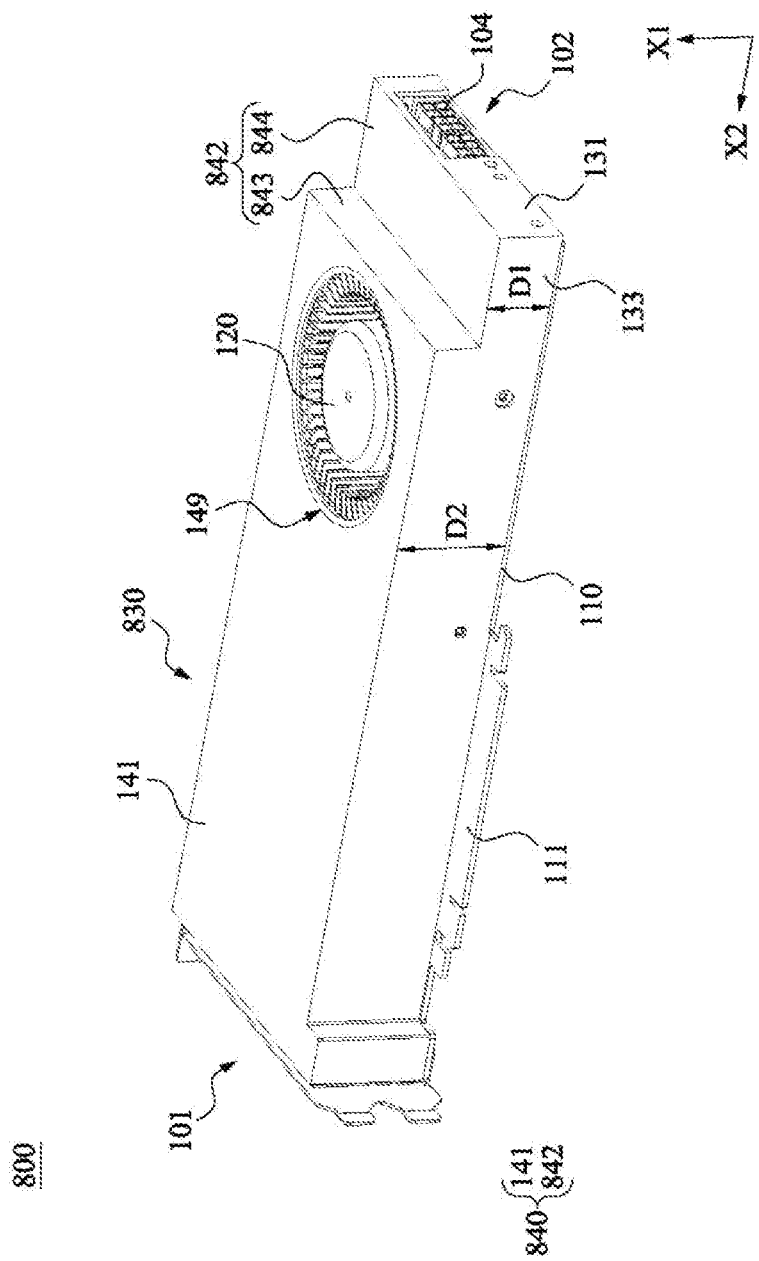
FIG. 4 is a three-dimensional diagram of a display card according to another embodiment of this application.

FIG. 4 is a three-dimensional diagram of a display card 800 according to another embodiment of this application. The display card 800 includes a circuit board 110, a fan 120, and a cover body 830. A top wall 840 of the cover body 830 includes a first covering portion 141 and a second covering portion 842 that are connected to each other. The second covering portion 842 includes a first bend section 843 and a second bend section 844. Same element symbols represent being substantially the same as the elements described in the foregoing embodiment with reference to FIG. 1 and FIG. 2. For brevity of the content, descriptions about these elements are not repeated herein. A difference between this embodiment and the embodiment shown in FIG. 1 and FIG. 2 is that the first bend section 843 of the cover body 830 of the display card 800 in this embodiment is close to an end of the fan 120, and straightly extends between the side walls 132 and 133 rather than crookedly extending along the shape of the fan 120.

Figure 5:
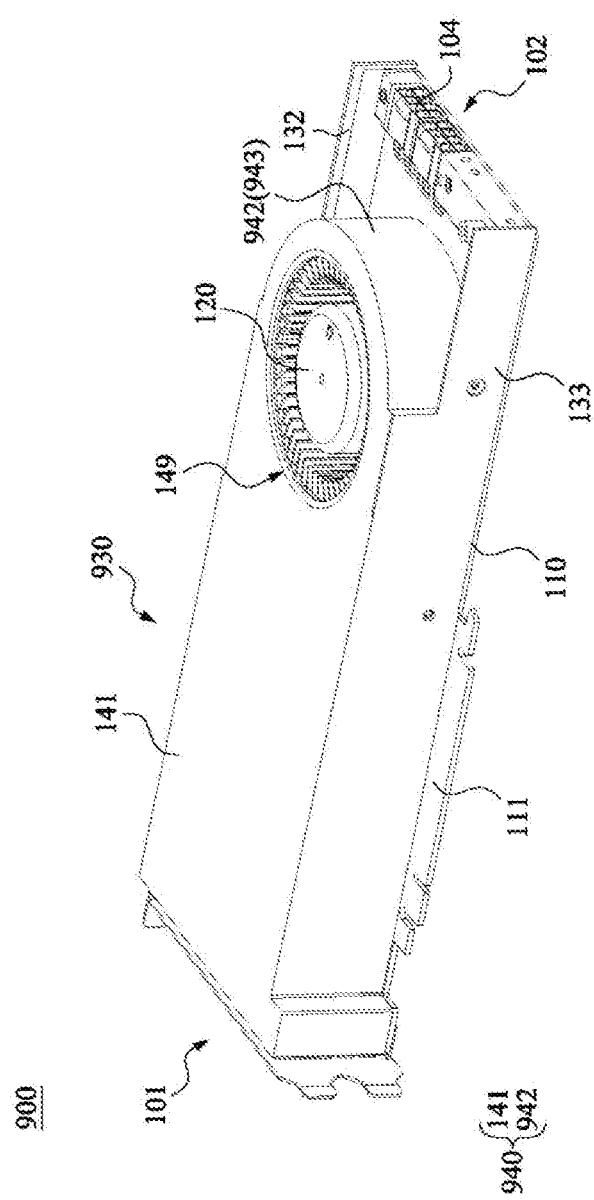
FIG. 5 is a three-dimensional diagram of a display card according to another embodiment of this application.

FIG. 5 is a three-dimensional diagram of a display card 900 according to another embodiment of this application. The display card 900 includes a circuit board 110, a fan 120, and a cover body 930. A top wall 940 of the cover body 930 includes a first covering portion 141 and a second covering portion 942 that are connected to each other. Same element symbols represent being substantially the same as the elements described in the foregoing embodiment with reference to FIG. 1 and FIG. 2. For brevity of the content, descriptions about these elements are not repeated herein. A difference between this embodiment and the embodiment shown in FIG. 1 and FIG. 2 is that an exposing opening is included between a first bend section 943 and side walls 132 and 133 of the cover body 930 of the display card 900 in this embodiment (which is regarded as that the side wall 131 of the cover body 130 and the second bend section 144 of the display card 100 are removed, and the second covering portion 942 only includes the first bend section 943), to expose a component (in an embodiment, the second connector 104) located at a second end 102 of the display card 900. This design also increases space between display cards 900 arranged side by side to facilitate the fan 120 to introduce air.

Figure 6:
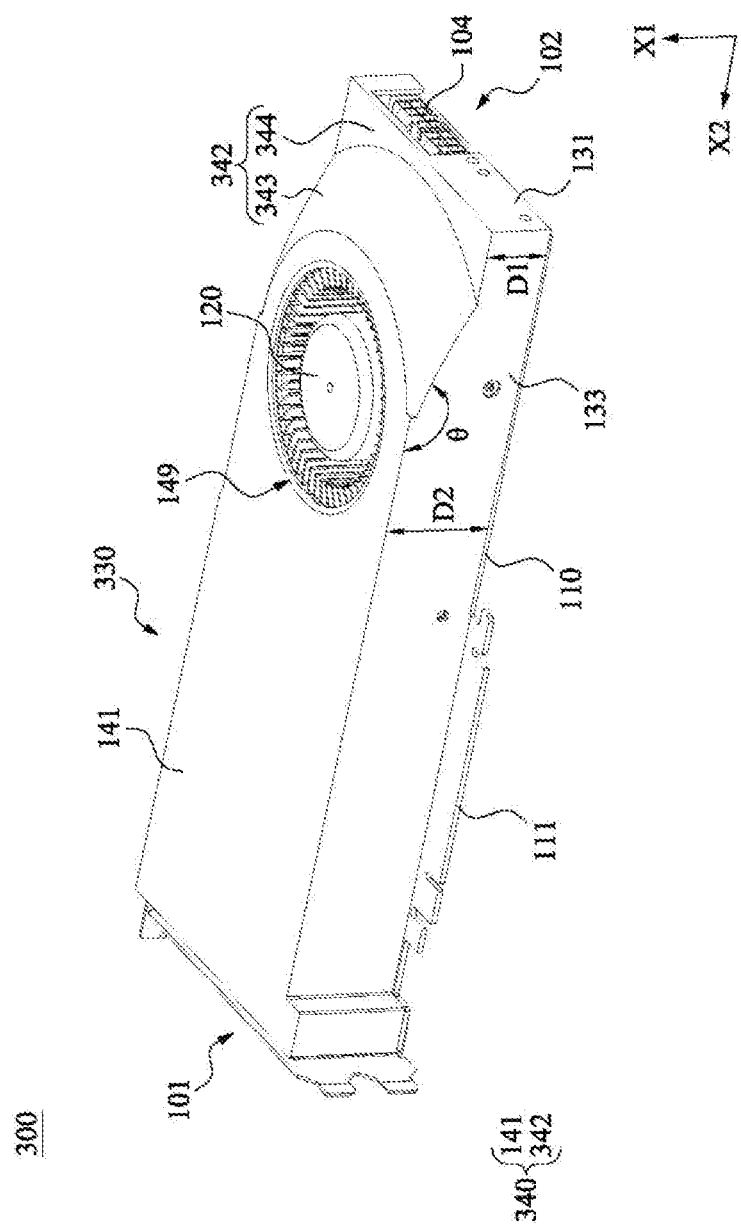
FIG. 6 is a three-dimensional diagram of a display card according to another embodiment of this application.

FIG. 6 is a three-dimensional diagram of a display card 300 according to another embodiment of this application. The display card 300 includes a circuit board 110, a fan 120, and a cover body 330. A top wall 340 of the cover body 330 includes a first covering portion 141 and a second covering portion 342 that are connected with each other, and the second covering portion 342 includes a first bend section 343 and a second bend section 344. Same element symbols represent being substantially the same as the elements described in the foregoing embodiment with reference to FIG. 1 and FIG. 2. For brevity of the content, descriptions about these elements are not repeated herein.

As shown in FIG. 6, in some embodiments, the first bend section 343 of the second covering portion 342 is an inclined surface, and the first bend section 343 is connected between the first covering portion 141 and the second bend section 344. The first bend section 343 extends from the first covering portion 141 towards the circuit board 110, and an angle θ between the first bend section 343 and the first covering portion 141 is an obtuse angle. A distance D1 between the second bend section 344 and the circuit board 110 is less than a distance D2 between the first covering portion 141 and the circuit board 110. The first bend section 343 aslant (but is not perpendicular to the first covering portion 141) extends from the first covering portion 141 to the second bend section 344. In the foregoing structure configuration, the first bend section 343 smoothly guides the airflow generated by the system fan to an air inlet (that is, the opening 149) of the fan 120.

Figure 7:
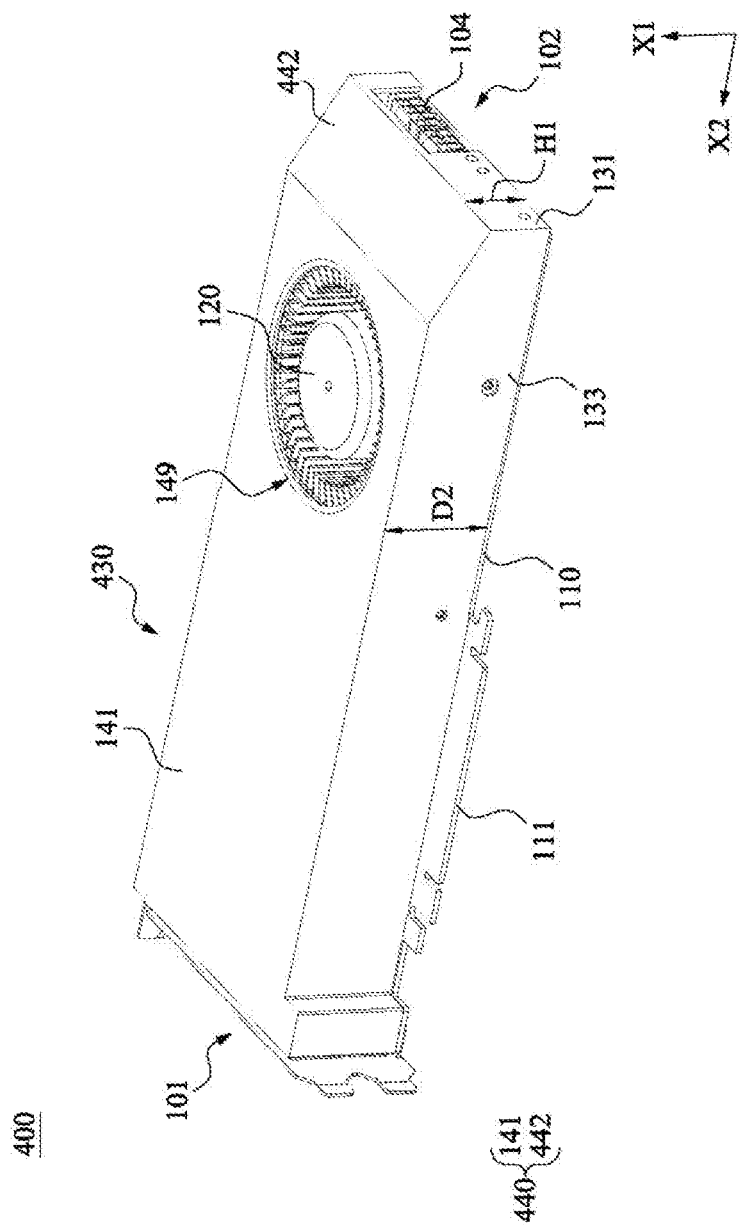
FIG. 7 is a three-dimensional diagram of a display card according to another embodiment of this application.

FIG. 7 is a three-dimensional diagram of a display card 400 according to another embodiment of this application. The display card 400 includes a circuit board 110, a fan 120, and a cover body 430. A top wall 440 of the cover body 430 includes a first covering portion 141 and a second covering portion 442 that are connected with each other. Same element symbols represent being substantially the same as the elements described in the foregoing embodiment with reference to FIG. 1 and FIG. 2. For brevity of the content, descriptions about these elements are not repeated herein.

Different from the design of the second covering portion 142 with two bend sections in the embodiment shown in FIG. 1 and FIG. 2, in this embodiment, as shown in FIG. 7, the second covering portion 442 is an inclined surface, and is aslant connected between the first covering portion 141 and a side wall 131. A distance D2 exists between the first covering portion 141 and the circuit board 110, and the side wall 131 includes a height H1 relative to the circuit board 110. A length of the height H1 is less than a length of the distance D2. The second covering portion 442 aslant (but is not perpendicular to the first covering portion 141) extends from the first covering portion 141 to the side wall 131. By using the foregoing structure configuration, the airflow generated by the system fan flows to the opening 149 along the side wall 131 and the second covering portion 442, and then the airflow is introduced by the fan 120 to the space between the cover body 430 and the circuit board 110 to perform heat dissipation on an electronic element disposed on the circuit board 110.

Figure 8:
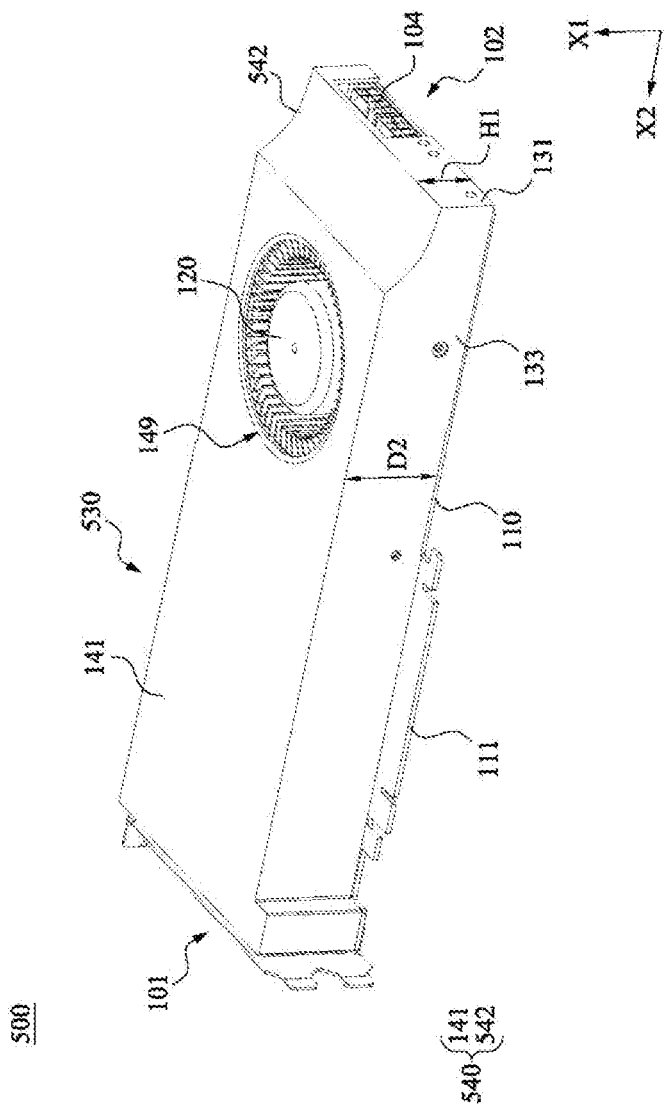
FIG. 8 is a three-dimensional diagram of a display card according to another embodiment of this application.

FIG. 8 is a three-dimensional diagram of a display card 500 according to another embodiment of this application. The display card 500 includes a circuit board 110, a fan 120, and a cover body 530. A top wall 540 of the cover body 530 includes a first covering portion 141 and a second covering portion 542 that are connected to each other. Same element symbols represent being substantially the same as the elements described in the foregoing embodiment with reference to FIG. 1 and FIG. 2. For brevity of the content, descriptions about these elements are not repeated herein. A difference between this embodiment and the embodiment shown in FIG. 7 is that the second covering portion 542 of the display card 500 in this embodiment is a curved surface connected between the first covering portion 141 and the side wall 131. The second covering portion 542 aslant (but is not perpendicular to the first covering portion 141) extends from the first covering portion 141 to the side wall 131, and caves in towards the circuit board 110.

In conclusion, the cover body of the display card of this application includes a top wall partially bending (is also considered as descending) towards the circuit board, and the bending part of the top wall is located on one side of the fan. In the foregoing structure configuration, even though a plurality of display cards is arranged closely, some space is still reserved between adjacent display cards. In this way, air intake of the fan is not obstructed, and the display card still effectively dissipates heat.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A display card, comprising:
   a circuit board comprising a bus connector;
   a fan, disposed on the circuit board; and
   a cover body, covering the circuit board, and comprising a top wall, a first side wall and a second side wall, wherein the second side wall is opposite to the first side wall, and the bus connector is located next to the first side wall, wherein the top wall comprises:
   a first covering portion, comprising an opening to expose the fan, wherein the first covering portion has an edge extending from the first side wall to the second side wall and curving along a circular outer boundary of the fan; and
   a second covering portion, connected to the first covering portion, and bending towards the circuit board, wherein the second covering portion comprises a first bend section connected to the edge of the first covering portion and extending towards the circuit board, and the first bend section has a concave surface facing the fan.

2. The display card according to claim 1, further comprising at least one first connector located at a first end of the display card, wherein the fan is located between the at least one first connector and the second covering portion.

3. The display card according to claim 1, wherein a part of the second covering portion encircles the fan.

4. The display card according to claim 1, wherein the second covering portion further comprises a second bend section, and the first bend section is connected between the second bend section and the first covering portion, and extends towards the circuit board from the first covering portion.

5. The display card according to claim 4, wherein a distance between the second bend section and the circuit board is less than a distance between the first covering portion and the circuit board.

6. The display card according to claim 4, wherein the second bend section is parallel to the first covering portion.

7. The display card according to claim 4, wherein an angle between the first bend section and the first covering portion is an obtuse angle.

8. The display card according to claim 4, wherein the first bend section is perpendicular to the first covering portion.

9. The display card according to claim 4, further comprising at least one first connector located at a first end of the display card, wherein the cover body further comprises a third side wall, the third side wall is located at a second end of the display card, and the second bend section is connected between the first bend section and the third side wall.

10. The display card according to claim 1, further comprising at least one first connector located at a first end of the display card, wherein the cover body further comprises a third side wall, the third side wall is located at a second end of the display card, the third side wall comprises a height relative to the circuit board, there is a distance between the first covering portion and the circuit board, and a length of the height is less than a length of the distance.

* * * * *